(12) United States Patent
Kim

(10) Patent No.: US 9,871,081 B2
(45) Date of Patent: Jan. 16, 2018

(54) FLEXIBLE DISPLAY DEVICE

(71) Applicant: Samsung Display Co., Ltd., Yongin-si, Gyeonggi-do (KR)

(72) Inventor: Nam Jin Kim, Suwon-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 14/869,711

(22) Filed: Sep. 29, 2015

(65) Prior Publication Data

US 2016/0284770 A1    Sep. 29, 2016

(30) Foreign Application Priority Data

Mar. 23, 2015    (KR) .................. 10-2015-0040043

(51) Int. Cl.
*H01L 27/32* (2006.01)
*H01L 51/52* (2006.01)
*H01L 51/00* (2006.01)

(52) U.S. Cl.
CPC ...... *H01L 27/3223* (2013.01); *H01L 27/3258* (2013.01); *H01L 51/0097* (2013.01); *H01L 51/5253* (2013.01); *H01L 2251/5338* (2013.01); *H01L 2251/566* (2013.01); *Y02E 10/549* (2013.01)

(58) Field of Classification Search
CPC .......... H01L 27/32; H01L 51/00; H01L 51/52
USPC ............................................... 257/88; 349/12
See application file for complete search history.

(56) References Cited

U.S. PATENT DOCUMENTS

| | | | |
|---|---|---|---|
| 2014/0138637 A1* | 5/2014 | Yang et al. | 257/40 |
| 2014/0232956 A1* | 8/2014 | Kwon et al. | 349/12 |
| 2015/0255522 A1* | 9/2015 | Sato et al. | 257/40 |
| 2015/0380685 A1* | 12/2015 | Lee | H01L 51/5243 257/40 |

FOREIGN PATENT DOCUMENTS

| | | |
|---|---|---|
| KP | 10-2014-0077818 A | 6/2014 |
| KR | 10-2012-0116185 A | 10/2012 |
| KR | 10-1234382 B1 | 2/2013 |
| KR | 10-1243796 B1 | 3/2013 |

* cited by examiner

*Primary Examiner* — Sheng Zhu
(74) *Attorney, Agent, or Firm* — Knobbe Martens Olson & Bear LLP

(57) ABSTRACT

A flexible display device is disclosed. In one aspect, the device includes a display substrate including a display area and a non-display area surrounding the display area, wherein the display area includes an emission element layer. An inorganic layer is formed over the display substrate in the display area and the non-display area, and a thin film encapsulation layer is formed over the inorganic layer and covering at least a portion of the inorganic layer. A plurality of dummy patterns are formed over the display substrate and the inorganic layer. The dummy patterns include a plurality of first dummy patterns formed in the non-display area of the display substrate not overlapping the inorganic layer, and a plurality of second dummy patterns formed in the non-display area of the of the display substrate overlapping the inorganic layer.

20 Claims, 7 Drawing Sheets

FLEXIBLE DISPLAY DEVICE

RELATED APPLICATIONS

This application claims priority to and the benefit of Korean Patent Application No. 10-2015-0040043 filed in the Korean Intellectual Property Office on Mar. 23, 2015, the entire contents of which are incorporated herein by reference.

BACKGROUND

Field

The described technology generally relates to a flexible display device.

Description of the Related Technology

An organic light-emitting diode (OLED) display can bend when a flexible substrate such as a plastic film is used instead of a rigid substrate like glass. That is, the flexible display includes a plastic film, and a number of pixel circuits each including an OLED formed on the plastic film.

While manufacturing the flexible OLED display, the plastic film is formed on a rigid carrier substrate like glass. The pixel circuit and the OLED are formed on the plastic film, and then the carrier substrate and the plastic film are separated from each other. The carrier substrate supports the plastic film that is kept flat during the manufacturing process.

The carrier substrate and the plastic film are formed in the shape of a mother board so as to simultaneously manufacture a plurality of flexible display devices, and the carrier substrate and the plastic film are cut to be individual flexible display devices.

After separation of the carrier substrate and the plastic film, the plastic film is cut or an external force is continuously applied to bend the flexible display device. In the process, the flexible display device is physically damaged and thus cracks can be formed. The cracks can spread to a display area through an inorganic layer causing that an internal permeation path to be formed. Environmental contaminants cause organic material degradation, leading to pixel shrinkage and the like.

The above information disclosed in this Background section is only to enhance the understanding of the background of the described technology, and therefore it can contain information that does not constitute the prior art that is already known in this country to a person of ordinary skill in the art.

SUMMARY OF CERTAIN INVENTIVE ASPECTS

One inventive aspect relates to a flexible display device that can prevent cracks formed on the outside of the flexible display device from spreading to a display area by forming dummy patterns in a non-display area of the flexible display device.

Another aspect is a flexible display device is provided. The flexible display device includes: a display substrate including a display area provided with an emission element layer and a non-display area other than the display area; an inorganic layer formed on the display substrate; and a thin film encapsulation layer formed on the inorganic layer and encapsulating the inorganic layer by covering at least a part of the inorganic layer, wherein dummy patterns are formed in at least one of the display substrate and the inorganic layer, and the dummy patterns include first dummy patterns formed in the non-display area of the display substrate and second dummy patterns formed on the non-display area of the inorganic layer.

Two or more of the first dummy patterns can be provided and are formed at a distance from each other.

The first dummy patterns can be protruding patterns.

The first dummy pattern can be formed of the same material as the inorganic layer.

The inorganic layer can include: a barrier layer formed above the display substrate; a first insulating layer formed above the barrier layer; and a second insulating layer formed above the first insulating layer.

The second dummy pattern can be formed of the same material as the second insulating layer.

The second dummy patterns can be formed in the upper surface of the second insulating layer.

Two or more of the second dummy patterns can be provided and are formed at a distance from each other.

The second dummy patterns can be concave patterns.

At least a part of the second dummy patterns can be formed to be covered by the thin film encapsulation layer.

Two or more of the second dummy patterns can be provided and arranged parallel to an end surface of the inorganic layer.

The second dummy patterns can be respectively arranged at each end surface of the inorganic layer.

Neighboring second dummy patterns are alternatively arranged.

Another aspect is a flexible display device, comprising: a display substrate including a display area and a non-display area surrounding the display area, wherein the display area includes an emission element layer; an inorganic layer formed over the display substrate in the display area and the non-display area; a thin film encapsulation layer formed over the inorganic layer and covering at least a portion of the inorganic layer; and a plurality of dummy patterns formed over the display substrate and the inorganic layer. The dummy patterns comprise: a plurality of first dummy patterns formed in the non-display area of the display substrate not overlapping the inorganic layer; and a plurality of second dummy patterns formed in the non-display area of the of the display substrate overlapping the inorganic layer.

In the above display device, each of the first dummy patterns are formed at a predetermined distance from an adjacent one of the first dummy patterns.

In the above display device, the first dummy patterns protrude away from the display substrate.

In the above display device, the first dummy patterns are formed of the same material as the inorganic layer.

In the above display device, the inorganic layer comprises: a barrier layer formed over the display substrate; a first insulating layer formed over the barrier layer; and a second insulating layer formed over the first insulating layer.

In the above display device, the second dummy patterns are formed of the same material as the second insulating layer.

In the above display device, the second dummy patterns are formed in the upper surface of the second insulating layer.

In the above display device, each of the second dummy patterns are formed at a predetermined distance from an adjacent one of the second dummy patterns.

In the above display device, the second dummy patterns are concave.

In the above display device, the thin film encapsulation layer covers at least a portion of the second dummy patterns.

In the above display device, the second dummy patterns extend substantially parallel to an edge of the inorganic layer.

In the above display device, the inorganic layer has a plurality of edges, wherein the second dummy patterns are formed adjacent to each of the edges of the inorganic layer.

In the above display device, the second dummy patterns have a plurality of portions and a plurality of gaps between two neighboring portions, wherein the portions and gaps of each of the second dummy pattern do not align with a neighboring second dummy pattern.

In the above display device, a top surface of the first dummy patterns and a top surface of the second dummy patterns are substantially equidistant from the display substrate.

Another aspect is a flexible display device, comprising: a display substrate including a display area and a non-display area surrounding the display area; an inorganic layer formed over the display substrate; a thin film encapsulation layer formed over the inorganic layer and covering at least a portion of the inorganic layer; a plurality of first dummy patterns formed in the non-display area; and a plurality of second dummy patterns formed in the non-display area closer to the display area than the first dummy patterns, wherein the thin film encapsulation layer covers at least one of the second dummy patterns.

In the above display device, the first dummy patterns are substantially rectangular and have first sides and second sides longer than the first sides, wherein at least one of the second sides of each of the first dummy patterns faces a second side of a neighboring first dummy pattern.

In the above display device, the first dummy patterns have substantially the same height as one another, wherein the second dummy patterns have substantially the same height as one another.

In the above display device, the second dummy patterns have a wave shape.

In the above display device, the thin film encapsulation layer covers the entirety of the inorganic layer and the second dummy patterns.

The above display device further comprises an organic light-emitting diode formed over the display substrate, wherein a bottom surface of the organic light-emitting diode is farther from the display substrate than top surfaces of the first and second dummy patterns.

According to at least one of the disclosed embodiments, cracks that can be formed from physical damage due to an external impact applied to the display device including an inorganic layer can be prevented from spreading into the display area in advance, and the spreading of cracks is blocked by dummy pattern layers arranged in the shape of slits, thereby preventing the generation of a crack spreading path.

BRIEF DESCRIPTION OF THE DRAWINGS

FIG. 3 shows that the second dummy patterns are formed in the shape of a straight line. FIG. 4 shows that the second dummy patterns are divided into two or more parts. FIG. 5 shows that the second dummy patterns are formed in the shape of waves. FIG. 6 shows that the second dummy patterns are formed at lateral sides of the inorganic layer.

DETAILED DESCRIPTION OF CERTAIN INVENTIVE EMBODIMENTS

Figure 1:
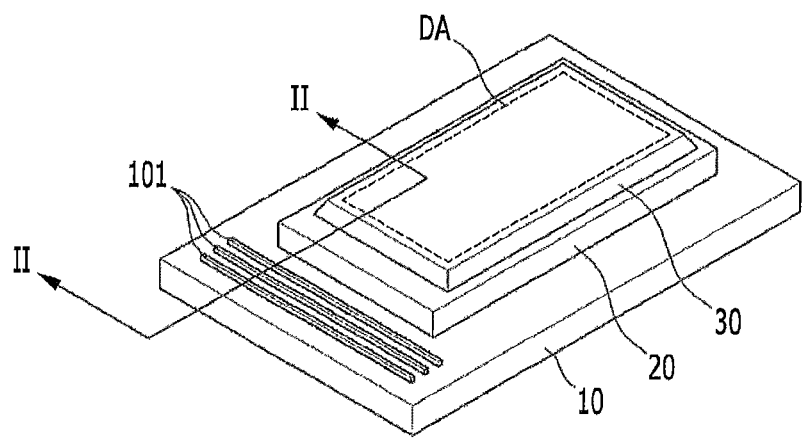
FIG. 1 is a schematic perspective view of a flexible display device according to an exemplary embodiment.

Hereinafter, an exemplary embodiment will be described in detail with reference to the accompanying drawings so that those skilled in the technical field to which the described technology pertains can carry out the exemplary embodiments. As those skilled in the art would realize, the described embodiments can be modified in various different ways, all without departing from the spirit or scope of the described technology. The drawings and description are to be regarded as illustrative in nature and not restrictive. Like reference numerals designate like elements throughout the specification.

It shall be noted that the drawings are schematic and do not depict exact dimensions. The relative proportions and ratios of elements in the drawings can be exaggerated or diminished in size for the sake of clarity and convenience in the drawings, and such arbitrary proportions are only illustrative and not limiting in any way. Like reference numerals are used for like structures, elements, or parts shown in two or more drawings to show similar characteristics. When one part is said to be "over" or "on" another part, the one part can be directly over or on the other part or there can be another part interposed therebetween.

Exemplary embodiments specifically show preferred exemplary embodiments. As a result, various modifications of the drawings are anticipated. Therefore, the exemplary embodiments are not limited to a specific form of an illustrated region, and, for example, include modifications of a manufactured form. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 2:
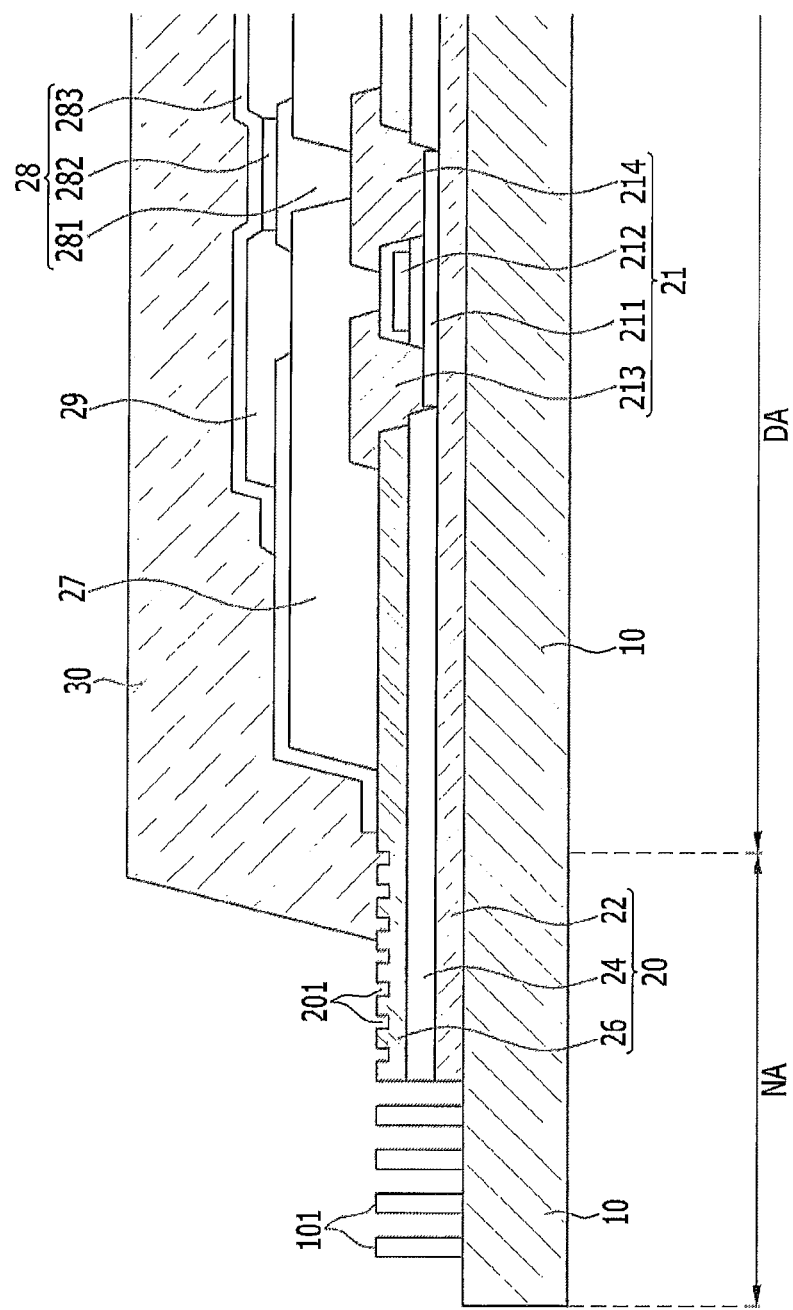
FIG. 2 is a cross-sectional view of FIG. 1, taken along the line II-II.

FIG. 1 is a schematic perspective view of a flexible display device according to an exemplary embodiment. FIG. 2 is a cross-sectional view of FIG. 1 taken along the line II-II.

Referring to FIG. 1 and FIG. 2, a flexible display device according to an exemplary embodiment includes a display substrate 10, an inorganic layer 20 formed on the display substrate 10, and a thin film encapsulation layer 30 formed on the inorganic layer 20.

The display substrate 10 is divided into a display area DA provided with an emission element layer and a non-display area NA surrounding the display area DA.

The inorganic layer 20 is formed on the substrate 10. The inorganic layer can be formed to wholly cover the display area DA1 and partially cover the non-display area NA of the display substrate 10, as shown in FIG. 1 and FIG. 2.

The inorganic layer 20 can include a barrier layer 22 formed above the display substrate 10, a first insulating layer 24 formed above the barrier layer 22, and a second insulating layer 26 formed above the first insulating layer 24.

The barrier layer 22 serves to prevent permeation of an impure element into the display area DA and to planarize the surface. The barrier layer 22 can be formed of various materials that can perform such functions. For example, the barrier layer 22 is formed of at least one of a silicon nitride ($SiN_x$) layer, a silicon oxide ($SiO_2$) layer, and a silicon oxynitride (SiO$_x$N$_y$) layer. However, the barrier layer 22 is not a prerequisite constituent element, and can be omitted according to the type of the display substrate and process conditions.

A driving semiconductor layer 211 is formed on the barrier layer 22 in the display area DA. The driving semiconductor layer 211 is formed as a polysilicon layer and includes a channel area in which impurities are not doped, and a source area and a drain area in which p+ impurities are doped at respective sides of the channel area. In this case, the doped ion materials are P-type impurities, such as boron (B), and B2H6 is mainly used. Here, the impurities vary according to a kind of thin film transistor 21.

A first insulating layer 24 is formed above the barrier layer 22. The first insulating layer 24 can be a gate insulating layer covering a driving gate electrode 212 of the thin film transistor 21 in the display area DA. The first insulating layer 24 includes through-holes that expose the source area and the drain area of the driving semiconductor layer 211. Data wires including a driving source electrode 213 and a driving drain electrode 214 are formed on the first insulating layer 24. The driving source electrode 213 and the driving drain electrode 214 are respectively connected to the source area and the drain area through the through-holes.

In the present exemplary embodiment, the thin film transistor 21 is a driving thin film transistor, and a pixel circuit further includes a switching thin film transistor and a capacitor. The switching thin film transistor is used as a switching element that selects a pixel for light emission, and the driving thin film transistor applies power for light emission of the selected pixel to the corresponding pixel. Here, the pixel implies a minimum light emission unit for displaying an image.

In some embodiments, the first insulating layer 24 is formed of a ceramic-based material such as silicon nitride (SiNx) or silicon oxide (SiO$_2$).

Meanwhile, the second insulating layer 26 is formed above the gate electrode 212 and the data wires. That is, the second insulating layer 26 can be an interlayer insulating layer that covers the data wires for insulation. Further, like the first insulating layer 24, the second insulating layer 26 includes through holes that expose the source area and the drain area.

In some embodiments, the second insulating layer 26 is also formed of a ceramic-based material such as silicon nitride (SiNx) or silicon oxide (SiO$_2$).

A planarization layer (not shown) and a passivation layer 27 can be further formed above the second insulating layer 26 in the display area DA. The planarization layer serves to remove and planarize a step in order to increase emission efficiency of an organic light emitting element (or organic light-emitting diode (OLED)) of a light emission element layer 28. Further, the planarization layer includes an electrode contact hole that partially exposes the driving drain electrode 214.

Meanwhile, the passivation layer 27 is further provided above the planarization layer to protect the planarization layer and the thin film transistor 21. The electrode contact hole that partially exposes the driving drain electrode 214 is formed in the passivation layer 27 and the planarization layer.

The light emission element layer 28 includes a pixel electrode 281 connected to the drain electrode 214 through the contact hole, a plurality of organic emission layers 282 formed on the pixel electrode 281, and a common electrode 283 covering the plurality of organic emission layers 282. A pixel defining layer 29 partitioning pixel areas is provided between the pixel electrode 281 and the common electrode 283, and the organic emission layer 282 is formed in an opening of the pixel defining layer 29.

One of the pixel electrode 281 and the common electrode 283 can be formed as a reflective layer and the other can be formed as a transflective layer or a transparent conductive layer. Light emitted from the organic emission layer 282 is reflected by the reflective layer and emitted to the outside through the transflective layer or the transparent conductive layer. In the case of the transflective layer, light emitted from the organic emission layer 282 is partially reflected back to the reflective layer such that a resonance structure is formed.

As shown in FIG. 2, a thin film encapsulation layer 30 is formed above the second insulating layer 26 to encapsulate the inorganic layer 20 and the display area DA. An end surface (or edge) of the thin film encapsulation layer is moved further back toward the display area DA compared to an end surface of the inorganic layer 30, and thus covers at least a portion of the inorganic layer 20. Alternatively, the thin film encapsulation layer 30 can be formed by alternately layering one or more organic layers and one or more inorganic layers. In this case, the inorganic layer and the organic layer can each be provided as a plurality.

The organic layer is formed of a polymer, and can be a single layer or a stacked layer formed of any one of, for example, polyethylene terephthalate, a polyimide, a polycarbonate, an epoxy, a polyethylene, and a polyacrylate. In some embodiments, the organic layer is formed of polyacrylate, and the organic layer includes a material produced by polymerizing a monomer component including a diacrylate-based monomer and a triacrylate-based monomer. A monoacrylate-based monomer can be further included in the monomer component. Further, a photoinitiator known in the art, such as TPO, can be further included in the monomer component, but the exemplary embodiment is not limited thereto.

The inorganic layer can be a monolayer or a multilayer containing a metal oxide or a metal nitride. In detail, the inorganic layer can be formed of any one of SiNx, Al$_2$O$_3$, SiO$_2$, and TiO$_2$.

The uppermost layer of the thin film encapsulation layer 30 which is exposed to the outside can be an inorganic layer for preventing moisture from permeating into the organic light emitting element.

Although not illustrated in the drawing, a halogenated metal layer including LiF can be further provided between the display area DA and the inorganic layer. The halogenated metal layer can prevent the display area DA from being damaged when the inorganic layer is formed by a sputtering manner or a plasma deposition manner.

A dummy pattern can be formed in at least one of the display substrate 10 and the inorganic layer 20. The dummy pattern is provided in the non-display area NA, and can prevent cracks from spreading toward the display area DA from the outside. The dummy pattern includes, as shown in FIG. 2, first dummy patterns 101 formed above the display substrate 10 and second dummy patterns 201 formed in the inorganic layer 20.

The first dummy patterns 101 can be formed on the non-display area NA of the display substrate 10. Two or more first dummy patterns 101 are arranged at a distance from each other on the inorganic layer 20, but as shown in FIG. 2, the first dummy patterns 101 can be protruding patterns that protrude from the display substrate 10.

Meanwhile, the first dummy pattern 101 can be formed of the same material as the inorganic layer 20. Accordingly, the first dummy patterns 101, which are the protruding patterns, can be easily manufactured by processing an end portion of the inorganic layer 20.

In the present exemplary embodiment, as shown in FIG. 1 and FIG. 2, the first dummy patterns 101 are arranged in the shape of slits that are separated at a constant distance from the end surface, but the shape, the quantity, and the alignment of the first dummy patterns 101 are not limited thereto. The first dummy patterns 101 can have a continuously curved wave shape, or can have protruding patterns having a continuous V-letter chevron-shaped cross-section, or the first dummy patterns 101 can be arranged to have irregular distances therebetween. That is, the shape of the display substrate, the protruding length of the end portion included in the non-display area NA of the display substrate 10, and the degree of externally applied physical impact can be considered in the design of the shape, quantity, location, and alignment of the first dummy patterns 101.

The second dummy patterns 201 can be formed in the non-display area NA of the inorganic layer 20 as shown in FIG. 2. The second dummy pattern 201 can block cracks spreading from the outside, together with the first dummy pattern 101, and particularly, when a crack is spreading to the inorganic layer 20, passing through the first dummy pattern 101, which is the primary crack blocking means, the second dummy pattern 201 secondarily prevents the cracks from spreading into the display area DA, thereby more firmly blocking the crack from spreading.

In a process for forming the inorganic layer 20, the inorganic layer 20 is layered first and then the surface of the second insulating layer 26 is laser-processed or etched such that the second dummy pattern 201 can be formed. That is, the second dummy pattern 201 is a pattern having a concave shape from the upper surface of the second insulating layer 20. In the present exemplary embodiment, as shown in FIG. 2, the second dummy patterns 201 are formed only in the upper surface of the second insulating layer 26, but the exemplary embodiment is not limited thereto. The second dummy patterns 201 can be formed only in the upper surface of the first insulating layer 24 or can be formed in the upper surfaces of both of the first and second insulating layers 26.

Like the first dummy pattern 101, two or more second dummy patterns 201 can be formed at a distance from each other. However, at least one of the second dummy patterns 201 can be covered by the encapsulation layer 30, as shown in FIG. 2. The encapsulation layer 30 encapsulates at least one of the second dummy patterns 201 by covering the same, but the concave portions of the second dummy patterns 201 can be filled by the encapsulation layer 30. Accordingly, a deposition defect due to a gap between the encapsulation layer 30 and the second dummy patterns 201 can be prevented.

Meanwhile, in the present exemplary embodiment, the second dummy pattern 201 is formed as a concave pattern from the upper surface of the second insulating layer 26, but the exemplary embodiment is not limited thereto. That is, the second dummy pattern 201 can be protruding patterns formed of the same material as the second insulating layer 26 in the upper surface of the second insulating layer, or the second dummy patterns 201 can be formed in the first insulating layer 24 of the barrier layer 22 rather than in the upper surface of the second insulating layer 26.

Various alignments of the second dummy patterns 201 will be described with reference to FIG. 3 to FIG. 6.

FIG. 3 to FIG. 6 show various shapes and alignments of the second dummy patterns of the flexible display device according to the exemplary embodiment. The second dummy patterns are formed in the shape of a straight line in FIG. 3. The second dummy patterns are divided into two or more parts in FIG. 4. The second dummy patterns are formed in the shape of waves in FIG. 5. The second dummy patterns are formed at lateral sides of the inorganic layer in FIG. 6.

Figure 3:
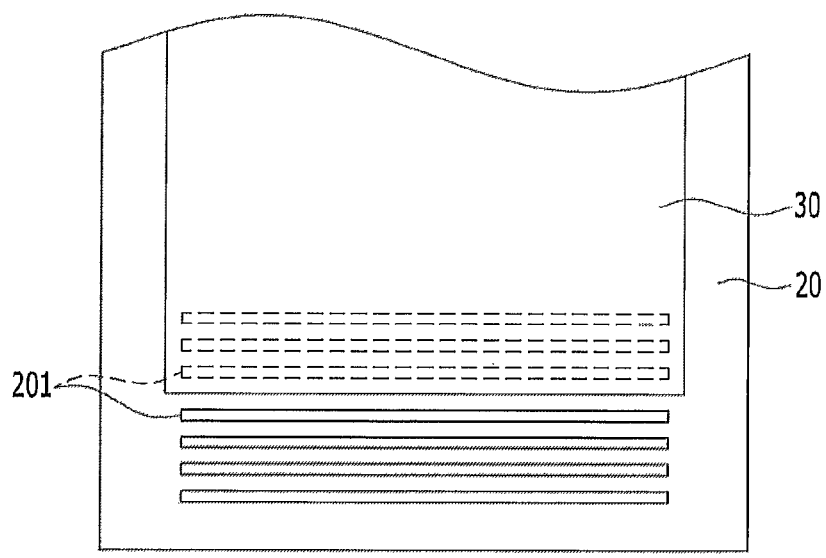
FIGS. 3, 4, 5 and 6 show various shapes and alignments of the second dummy patterns of the flexible display device according to the exemplary embodiment.

Referring to FIG. 2 and FIG. 3, two or more second dummy patterns 201 can be formed at a distance from each other parallel to an end surface of the inorganic layer 20, as shown in FIG. 3. That is, like the first dummy patterns 101 in FIG. 2, the second dummy patterns 201 can be arranged in the shape of slits in FIG. 3.

Figure 4:
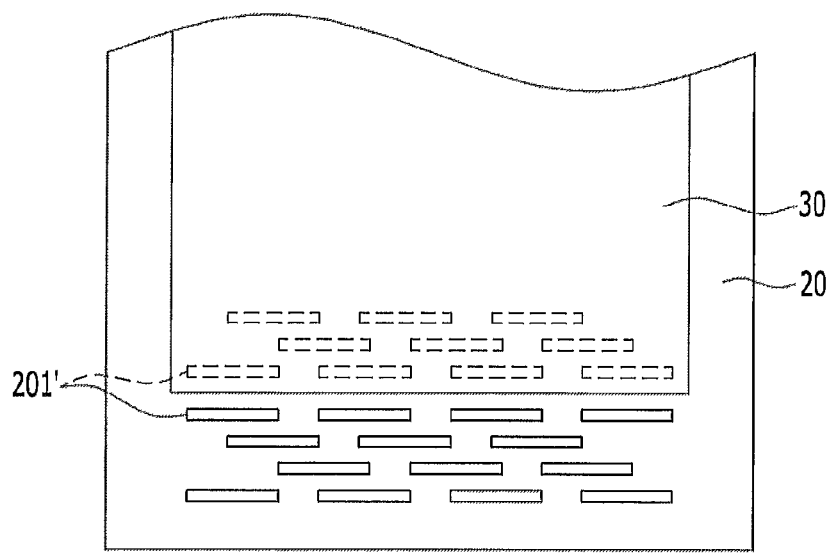

Referring to FIG. 4, two or more second dummy patterns 201' are arranged parallel to the end surface of the inorganic layer 20 with a shorter length than that of the second dummy pattern 201, but can be alternately arranged in a direction toward the display area DA.

Figure 5:
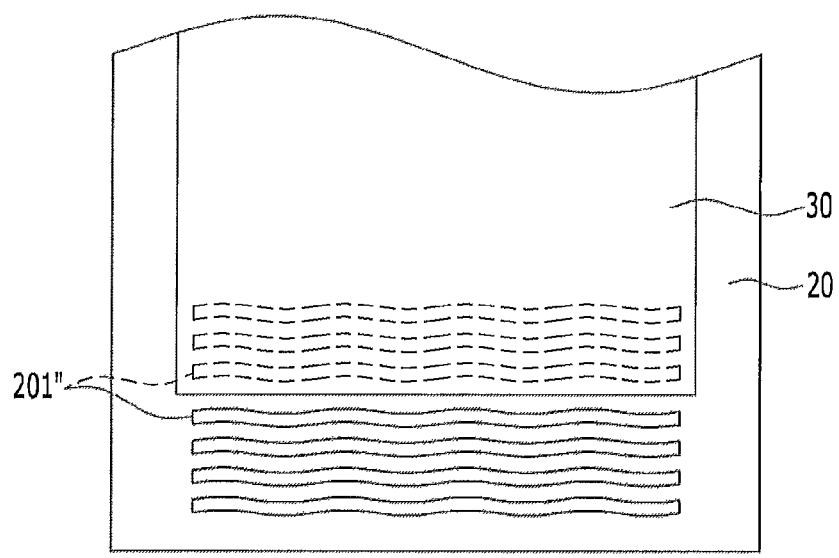

Referring to FIG. 5, second dummy patterns 201' have wave-shaped cross-sections, unlike the dummy patterns 201 and 201' that have bar-shaped cross-sections in FIG. 3 and FIG. 4.

Figure 6:
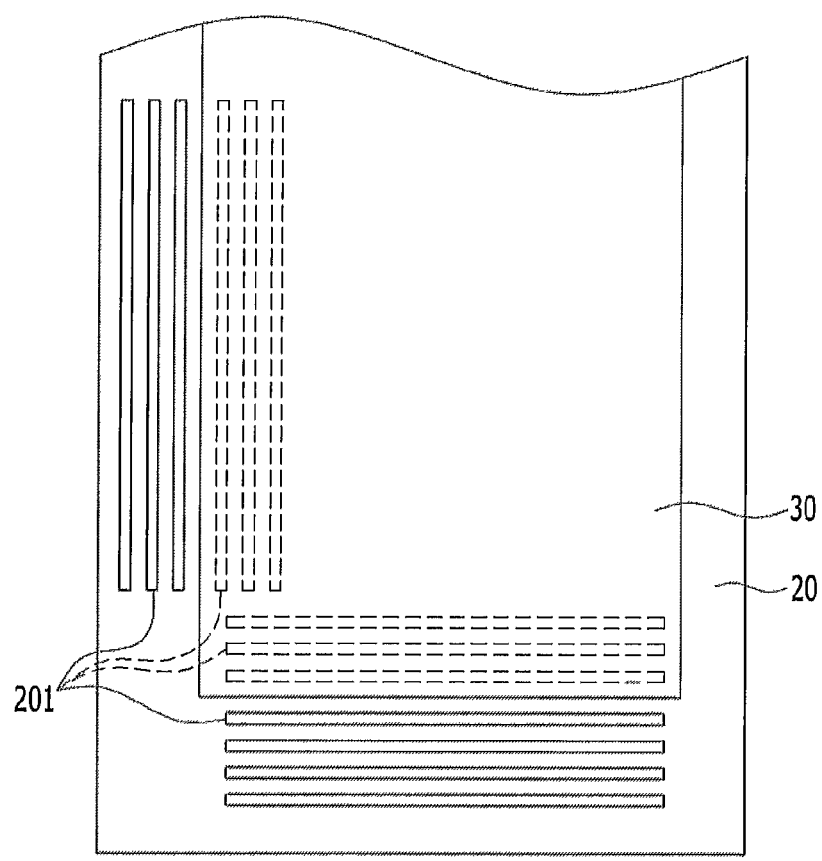

Referring to FIG. 6, the second dummy patterns can be arranged along the end surface of the inorganic layer 20. That is, compared to FIG. 3, the second dummy patterns 201 can be respectively formed parallel to the end surfaces of the inorganic layers 20 rather than any one end surface of the inorganic layer 20. When the second dummy patterns 201 are arranged as shown in FIG. 6, the generation and spread of cracks in several directions can be more effectively prevented compared to FIG. 3.

As described, in the flexible display device according to the exemplary embodiment, the first dummy patterns 101 are formed on the display substrate 10 and the second dummy patterns 201 are formed on the inorganic layer 20, such that spread of cracks can be blocked by the first and second dummy patterns 101 and 201 arranged in the shape of slits, thereby preventing damage to the display area DA due to the cracks.

Hereinafter, a flexible display device according to another exemplary embodiment will be described with reference to FIG. 7. When describing the flexible display device according to the other exemplary embodiment, a detailed description of the same configuration as the display device mentioned regarding FIG. 1 to FIG. 6 will be omitted.

Figure 7:
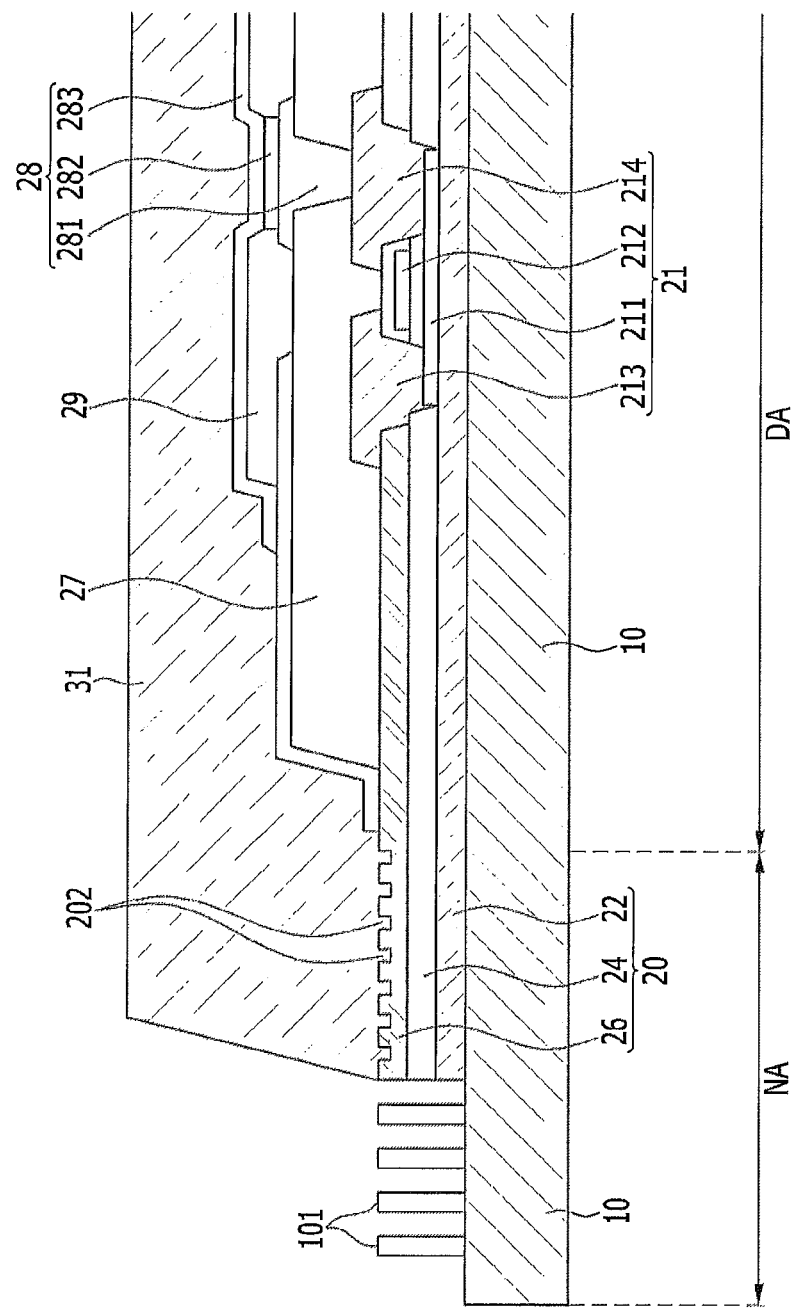
FIG. 7 is a schematic cross-sectional view of a flexible display device according to another exemplary embodiment.

FIG. 7 is a schematic cross-sectional view of a flexible display device according to another exemplary embodiment.

The flexible display device according to the other exemplary embodiment is the same as the flexible display device of FIG. 1 to FIG. 6, except that the upper portion of an inorganic layer 20 is wholly covered by a thin film encapsulation layer 31.

The thin film encapsulation layer 31 encapsulates the inorganic layer 20 by wholly covering the upper portion of the inorganic layer 20. Accordingly, as shown in FIG. 7, the second dummy patterns 202 are wholly covered by the thin film encapsulation layer 31. Further, concave portions of the second dummy patterns 202 are filled by the thin film encapsulation layer 31.

That is, unlike the flexible display device of FIG. 1 to FIG. 6, in the flexible display device according to the present exemplary embodiment, the inorganic layer 20 is protected by being wholly covered and at the same time the concave portions of the second dummy patterns 202 are filled by the thin film encapsulation layer 31 such that generation of gaps between the thin film encapsulation layer 31 and the inorganic layer 20 can be prevented and the permeation of gas through the gap between the thin film encapsulation layer 31 and the inorganic layer 20 can be blocked.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flexible display device, comprising:
    a display substrate including a display area and a non-display area surrounding the display area, wherein the display area includes an emission element layer;
    an inorganic layer formed over the display substrate in the display area and the non-display area;
    a thin film encapsulation layer formed over the inorganic layer and covering at least a portion of the inorganic layer; and
    a plurality of dummy patterns formed over the display substrate and the inorganic layer,
    wherein the dummy patterns comprise:
    a plurality of first dummy patterns formed in the non-display area of the display substrate not overlapping the inorganic layer; and
    a plurality of second dummy patterns formed in the non-display area of the display substrate overlapping the inorganic layer,
    wherein the thin film encapsulation layer does not cover any of the first dummy patterns,
    wherein the plurality of first dummy patterns do not overlap the inorganic layer and the thin film encapsulation, and
    the plurality of second dummy patterns overlap the inorganic layer and the thin film encapsulation, and
    wherein the thin film encapsulation layer directly contacts at least one of the second dummy patterns.

2. The flexible display device of claim 1, wherein each of the first dummy patterns are formed at a predetermined distance from an adjacent one of the first dummy patterns.

3. The flexible display device of claim 1, wherein the first dummy patterns protrude away from the display substrate.

4. The flexible display device of claim 1, wherein the first dummy patterns are formed of the same material as the inorganic layer.

5. The flexible display device of claim 1, wherein the inorganic layer comprises:
    a barrier layer formed over the display substrate;
    a first insulating layer formed over the barrier layer; and
    a second insulating layer formed over the first insulating layer.

6. The flexible display device of claim 5, wherein the second dummy patterns are formed of the same material as the second insulating layer.

7. The flexible display device of claim 5, wherein the second dummy patterns are formed in the upper surface of the second insulating layer.

8. The flexible display device of claim 1, wherein each of the second dummy patterns are formed at a predetermined distance from an adjacent one of the second dummy patterns.

9. The flexible display device of claim 1, wherein the second dummy patterns are concave.

10. The flexible display device of claim 1, wherein the thin film encapsulation layer covers at least a portion of the second dummy patterns.

11. The flexible display device of claim 1, wherein the second dummy patterns extend substantially parallel to an edge of the inorganic layer.

12. The flexible display device of claim 11, wherein the inorganic layer has a plurality of edges, and wherein the second dummy patterns are formed adjacent to each of the edges of the inorganic layer.

13. The flexible display device of claim 11, wherein the second dummy patterns have a plurality of portions and a plurality of gaps between two neighboring portions, and wherein the portions and gaps of each of the second dummy pattern do not align with a neighboring second dummy pattern.

14. The flexible display device of claim 1, wherein a top surface of the first dummy patterns and a top surface of the second dummy patterns are substantially equidistant from the display substrate.

15. A flexible display device, comprising:
    a display substrate including a display area and a non-display area surrounding the display area;
    an inorganic layer formed over the display substrate;
    a thin film encapsulation layer formed over the inorganic layer and covering at least a portion of the inorganic layer;
    a plurality of first dummy patterns formed in the non-display area; and
    a plurality of second dummy patterns formed in the non-display area closer to the display area than the first dummy patterns,
    wherein the thin film encapsulation layer covers at least one of the second dummy patterns and does not cover any of the first dummy patterns,
    wherein the plurality of first dummy patterns do not overlap the inorganic layer and the thin film encapsulation, and
    the plurality of second dummy patterns overlap the inorganic layer and the thin film encapsulation, and
    wherein the thin film encapsulation layer directly contacts at least one of the second dummy patterns.

16. The flexible display device of claim 15, wherein the first dummy patterns are substantially rectangular and have first sides and second sides longer than the first sides, and wherein at least one of the second sides of each of the first dummy patterns faces a second side of a neighboring first dummy pattern.

17. The flexible display device of claim 15, wherein the first dummy patterns have substantially the same height as one another, and wherein the second dummy patterns have substantially the same height as one another.

18. The flexible display device of claim 15, wherein the second dummy patterns have a wave shape.

19. The flexible display device of claim 15, wherein the thin film encapsulation layer covers the entirety of the inorganic layer and the second dummy patterns.

20. The flexible display device of claim 15, further comprising an organic light-emitting diode formed over the display substrate, wherein a bottom surface of the organic light-emitting diode is farther from the display substrate than top surfaces of the first and second dummy patterns.

* * * * *